US012702058B2

(12) United States Patent
Agarwal et al.

(10) Patent No.: US 12,702,058 B2
(45) Date of Patent: Aug. 4, 2026

(54) THREE-DIMENSIONAL SEMICONDUCTOR PACKAGE HAVING A STACKED PASSIVE DEVICE

(71) Applicant: ADVANCED MICRO DEVICES, INC., Santa Clara, CA (US)

(72) Inventors: Rahul Agarwal, Santa Clara, CA (US); Raja Swaminathan, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 765 days.

(21) Appl. No.: 17/512,109

(22) Filed: Oct. 27, 2021

(65) Prior Publication Data

US 2023/0130354 A1 Apr. 27, 2023

(51) Int. Cl.
| | |
|---|---|
| *H01L 23/48* | (2006.01) |
| *H01L 23/00* | (2006.01) |
| *H10W 20/20* | (2026.01) |
| *H10W 70/60* | (2026.01) |
| *H10W 72/00* | (2026.01) |
| *H10W 74/10* | (2026.01) |
| *H10W 80/00* | (2026.01) |
| *H10W 90/00* | (2026.01) |
| *H01L 23/31* | (2006.01) |
| *H01L 25/16* | (2023.01) |

(52) U.S. Cl.
CPC .......... *H10W 90/00* (2026.01); *H10W 20/20* (2026.01); *H10W 70/60* (2026.01); *H10W 74/111* (2026.01); *H10W 72/07236* (2026.01); *H10W 80/312* (2026.01); *H10W 80/327* (2026.01); *H10W 90/728* (2026.01); *H10W 90/798* (2026.01)

(58) Field of Classification Search
None
See application file for complete search history.

(56) References Cited

U.S. PATENT DOCUMENTS

| | | | | |
|---|---|---|---|---|
| 9,093,429 | B2 * | 7/2015 | McShane | ................ H01L 23/13 |
| 9,368,450 | B1 * | 6/2016 | Gu | ........................ H01L 23/5385 |
| 9,455,158 | B2 * | 9/2016 | Tsai | .................. H01L 21/76877 |
| 11,676,942 | B2 * | 6/2023 | Chen | ...................... H01L 25/105 |
| | | | | 257/668 |
| 11,862,618 | B2 * | 1/2024 | Lee | ...................... H01L 23/5226 |
| 12,009,303 | B2 * | 6/2024 | Kim | ........................ H01L 23/36 |
| 2002/0074669 | A1 | 6/2002 | Watanabe et al. | |

(Continued)

FOREIGN PATENT DOCUMENTS

WO WO-2020103162 A1 * 5/2020

OTHER PUBLICATIONS

International Search Report and Written Opinion, PCT/US2022/047817, Feb. 20, 2023, 10 pages.

*Primary Examiner* — Telly D Green

(57) ABSTRACT

A three-dimensional semiconductor package assembly includes a die. The die includes a plurality of through silicon vias (TSVs). The TSVs includes a first TSV and a second TSV. The first TSV supplies power from an active surface of the die to a back surface of the die. The assembly also includes a passive device coupled to the back surface of the die such that conductive contacts of the passive device electrically interface with the TSVs. The first passive device receives power through the first TSV and supplies power to the first die through the second TSV.

20 Claims, 10 Drawing Sheets

(56) References Cited

U.S. PATENT DOCUMENTS

| | | | | | |
|---|---|---|---|---|---|
| 2009/0057867 | A1 | 3/2009 | Hool | | |
| 2010/0295189 | A1* | 11/2010 | Chou | H01L 25/0657 | 257/E23.141 |
| 2011/0171827 | A1* | 7/2011 | Farooq | H01L 21/76898 | 438/653 |
| 2011/0316147 | A1* | 12/2011 | Shih | H01L 23/147 | 257/737 |
| 2012/0018876 | A1* | 1/2012 | Wu | H01L 23/3157 | 257/E21.597 |
| 2012/0091593 | A1* | 4/2012 | Cheng | H01L 21/763 | 716/110 |
| 2012/0193785 | A1* | 8/2012 | Lin | H01L 21/76898 | 257/737 |
| 2013/0203215 | A1* | 8/2013 | Hung | H01L 21/78 | 438/107 |
| 2013/0264688 | A1* | 10/2013 | Qian | H01L 24/94 | 257/E29.022 |
| 2014/0001641 | A1* | 1/2014 | Mcshane | H01L 23/481 | 257/E21.586 |
| 2014/0217604 | A1* | 8/2014 | Chou | H01L 25/50 | 257/774 |
| 2014/0264709 | A1* | 9/2014 | Tsai | H01L 23/5226 | 438/26 |
| 2014/0264862 | A1* | 9/2014 | Tsai | H10F 39/199 | 257/774 |
| 2014/0264929 | A1* | 9/2014 | Tsai | H01L 21/76898 | 257/774 |
| 2014/0264947 | A1* | 9/2014 | Lin | H01L 21/768 | 438/455 |
| 2015/0041980 | A1* | 2/2015 | Ahn | H01L 21/6835 | 257/738 |
| 2015/0115464 | A1* | 4/2015 | Yu | H01L 24/32 | 438/109 |
| 2015/0187701 | A1* | 7/2015 | Tsai | H01L 21/76898 | 257/621 |
| 2015/0348905 | A1* | 12/2015 | Tsai | H01L 21/4846 | 257/774 |
| 2016/0086997 | A1* | 3/2016 | Okamoto | H01L 23/481 | 257/448 |
| 2017/0154868 | A1* | 6/2017 | Jo | H01L 25/0652 | |
| 2019/0006277 | A1 | 1/2019 | Cheah et al. | | |
| 2020/0020634 | A1* | 1/2020 | Tsai | H01L 24/73 | |
| 2020/0035647 | A1* | 1/2020 | Chen | H01L 24/96 | |
| 2020/0273840 | A1 | 8/2020 | Elsherbini et al. | | |
| 2021/0098323 | A1* | 4/2021 | Yu | H01L 23/5226 | |
| 2021/0111124 | A1* | 4/2021 | Elsherbini | H01L 24/19 | |
| 2021/0111154 | A1* | 4/2021 | Elsherbini | H01L 25/0655 | |
| 2021/0111170 | A1* | 4/2021 | Elsherbini | H01L 24/83 | |
| 2021/0202389 | A1* | 7/2021 | Hsieh | H01L 24/96 | |
| 2022/0130761 | A1* | 4/2022 | Kim | H01L 23/5226 | |
| 2022/0165721 | A1* | 5/2022 | Lee | H01L 24/08 | |

* cited by examiner

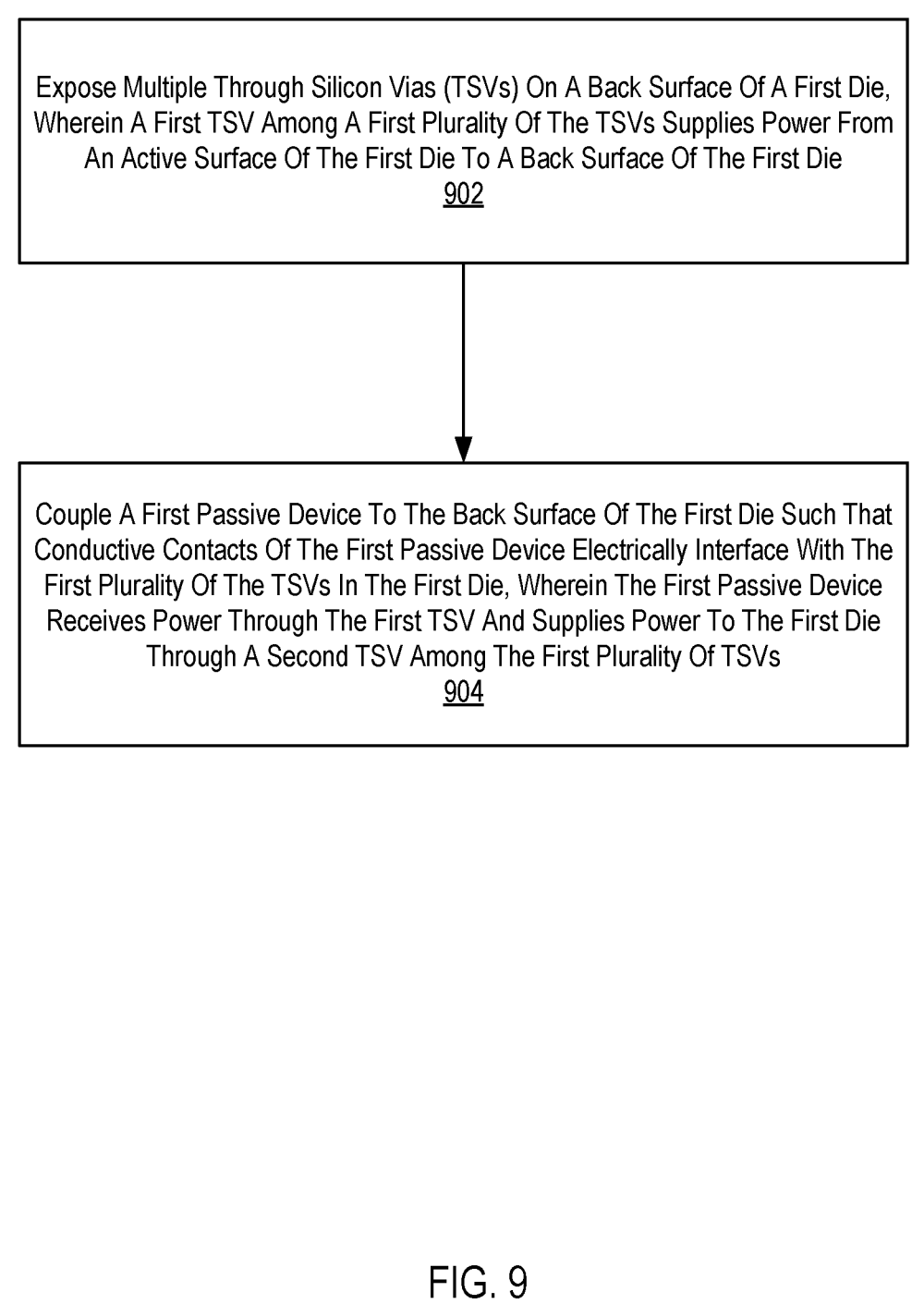

Expose Multiple Through Silicon Vias (TSVs) On A Back Surface Of A First Die, Wherein A First TSV Among A First Plurality Of The TSVs Supplies Power From An Active Surface Of The First Die To A Back Surface Of The First Die
902

Couple A First Passive Device To The Back Surface Of The First Die Such That Conductive Contacts Of The First Passive Device Electrically Interface With The First Plurality Of The TSVs In The First Die, Wherein The First Passive Device Receives Power Through The First TSV And Supplies Power To The First Die Through A Second TSV Among The First Plurality Of TSVs
904

FIG. 9

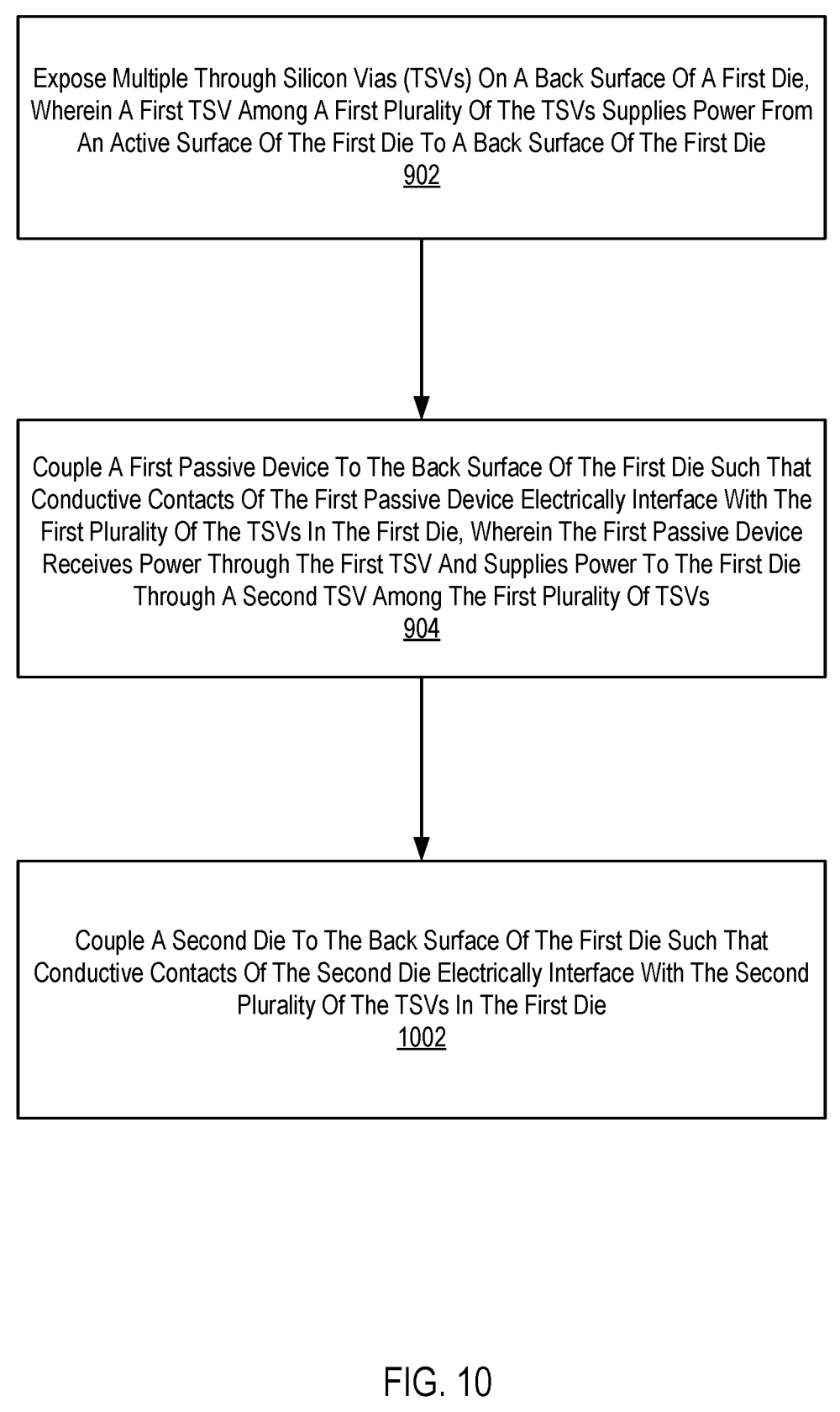

Expose Multiple Through Silicon Vias (TSVs) On A Back Surface Of A First Die, Wherein A First TSV Among A First Plurality Of The TSVs Supplies Power From An Active Surface Of The First Die To A Back Surface Of The First Die
902

Couple A First Passive Device To The Back Surface Of The First Die Such That Conductive Contacts Of The First Passive Device Electrically Interface With The First Plurality Of The TSVs In The First Die, Wherein The First Passive Device Receives Power Through The First TSV And Supplies Power To The First Die Through A Second TSV Among The First Plurality Of TSVs
904

Couple A Second Die To The Back Surface Of The First Die Such That Conductive Contacts Of The Second Die Electrically Interface With The Second Plurality Of The TSVs In The First Die
1002

FIG. 10

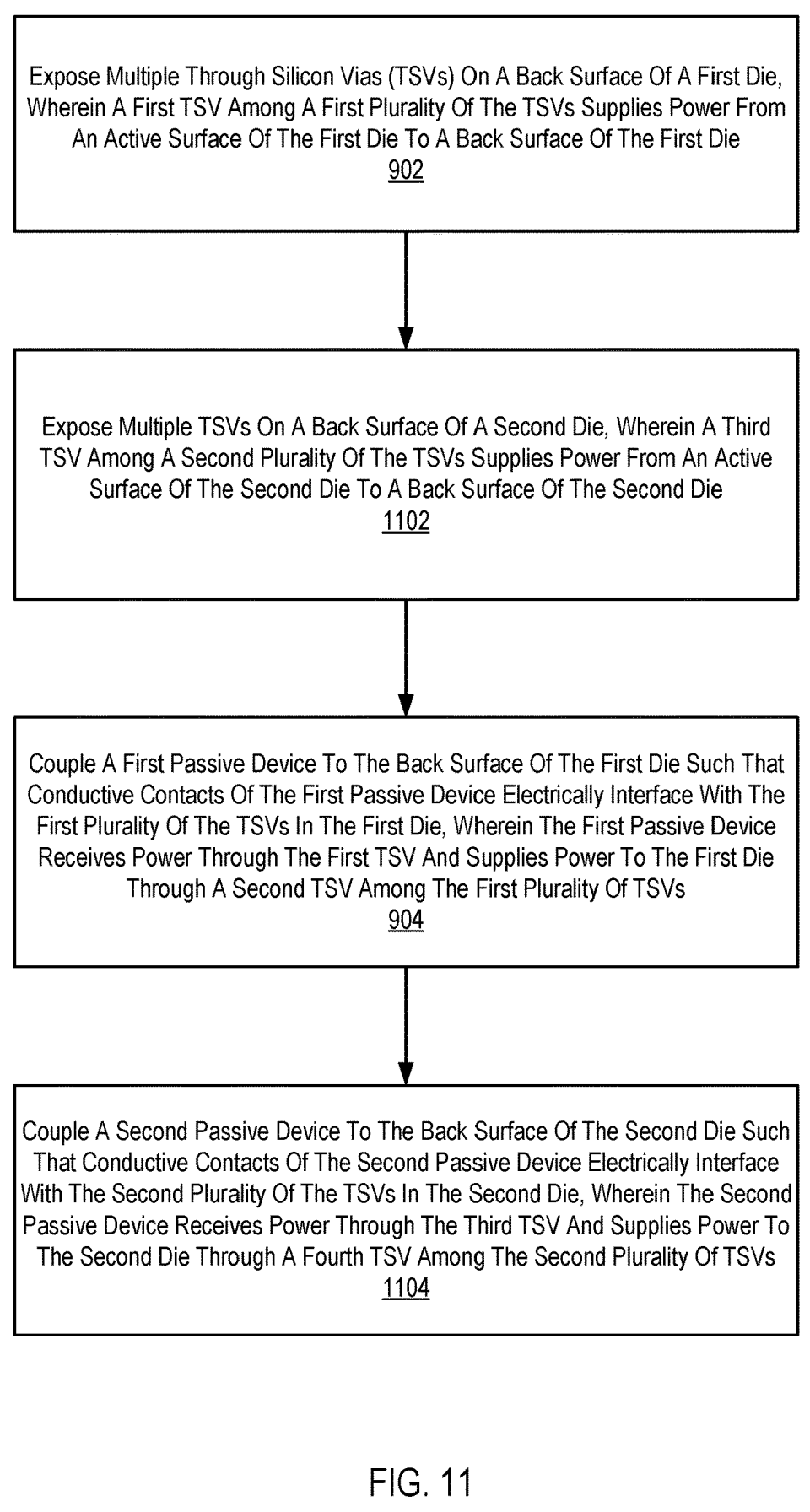

Expose Multiple Through Silicon Vias (TSVs) On A Back Surface Of A First Die, Wherein A First TSV Among A First Plurality Of The TSVs Supplies Power From An Active Surface Of The First Die To A Back Surface Of The First Die
902

Expose Multiple TSVs On A Back Surface Of A Second Die, Wherein A Third TSV Among A Second Plurality Of The TSVs Supplies Power From An Active Surface Of The Second Die To A Back Surface Of The Second Die
1102

Couple A First Passive Device To The Back Surface Of The First Die Such That Conductive Contacts Of The First Passive Device Electrically Interface With The First Plurality Of The TSVs In The First Die, Wherein The First Passive Device Receives Power Through The First TSV And Supplies Power To The First Die Through A Second TSV Among The First Plurality Of TSVs
904

Couple A Second Passive Device To The Back Surface Of The Second Die Such That Conductive Contacts Of The Second Passive Device Electrically Interface With The Second Plurality Of The TSVs In The Second Die, Wherein The Second Passive Device Receives Power Through The Third TSV And Supplies Power To The Second Die Through A Fourth TSV Among The Second Plurality Of TSVs
1104

FIG. 11

THREE-DIMENSIONAL SEMICONDUCTOR PACKAGE HAVING A STACKED PASSIVE DEVICE

BACKGROUND

Packaged integrated circuits typically include a semiconductor chip mounted on a carrier substrate. The carrier substrate is configured to mount to a printed circuit board, such as a motherboard or card. The conventional carrier substrate includes an interconnect system that is made up of multiple layers of conductor planes or traces tied vertically by plural vias. Input/output pads on the die side of the carrier substrate connect to the die and input/output pads on the underside of the carrier substrate connect to the printed circuit board. A ball grid array, a land grid array, or pin grid array is used to electrically connect the underside input/output pads to the printed circuit board.

In packaged integrated circuits, power is normally delivered to integrated circuits via a power supply and some form of power delivery network. Although currently-available power supplies are designed to supply stable voltages, the actual power delivered to integrated circuits can contain significant amounts of noise. There are many sources of noise, such as voltage fluctuations caused by other devices coupled to the power supply, electromagnetic interference, and other causes.

BRIEF DESCRIPTION OF THE DRAWINGS

FIG. 9 is a flowchart of an example method of fabricating a three-dimensional semiconductor package having a stacked passive device according to some implementations.

FIG. 10 is a flowchart of another example method of fabricating a three-dimensional semiconductor package having a stacked passive device according to some implementations.

FIG. 11 is a flowchart of another example method of fabricating a three-dimensional semiconductor package having a stacked passive device according to some implementations.

DETAILED DESCRIPTION

Figure 1:
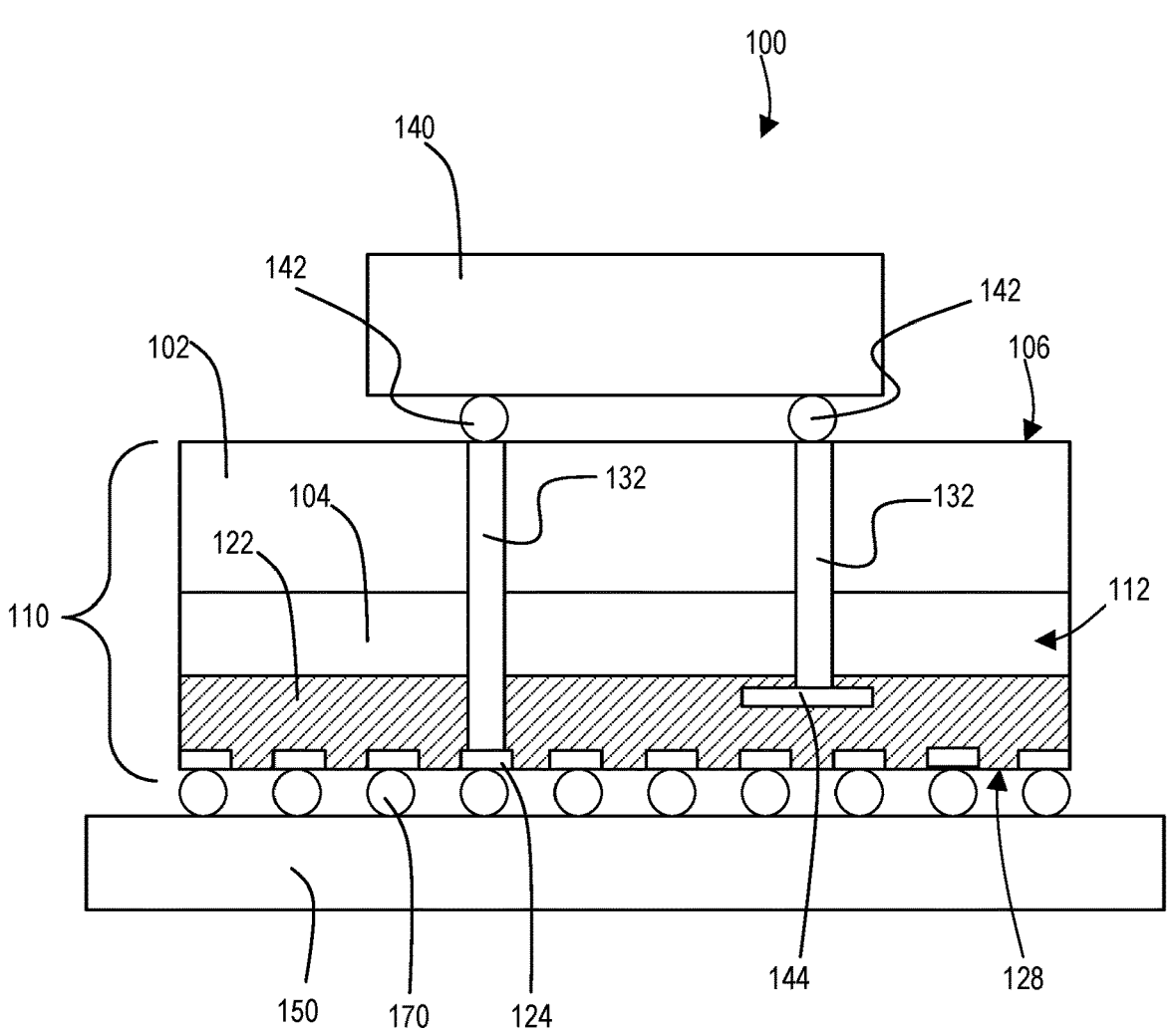
FIG. 1 sets forth a cross section block diagram of an example three-dimensional semiconductor package having a stacked passive device according to some implementations of the present disclosure.
Figure 2:
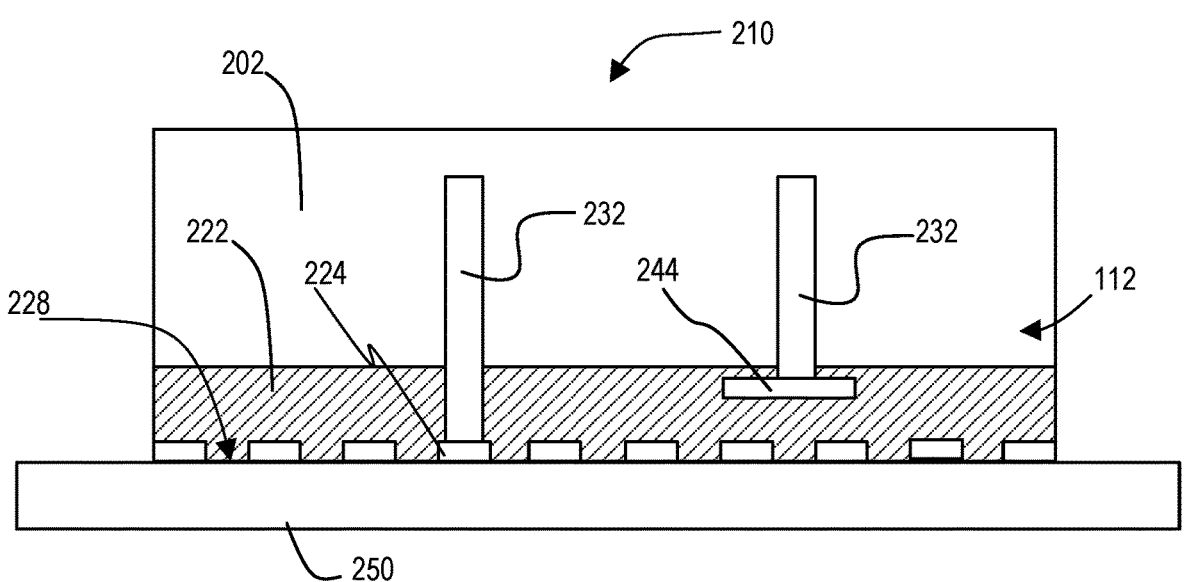
FIG. 2 is a portion of an example process flow for fabricating a three-dimensional semiconductor package having a stacked passive device according to some implementations.

To address issues associated with power supply noise, semiconductor chip packages often use decoupling capacitors. Many of these decoupling capacitors are mounted on the package substrate. In one variant, the decoupling capacitors are mounted to the die side of the substrate around the periphery of the die. In another variant, the decoupling capacitors are mounted to the underside of the substrate.

Passive devices such as capacitors that are used to lower switching noise must be in close proximity to the integrated circuitry in a semiconductor die. In some examples, low temperature co-fired ceramic (LTCC) chip capacitors are placed on the substrate on the die side of the package, typically a few millimeters away from the die. Land or ball side chip capacitors can also be used to provide a shorter routing to integrated circuitry. However, this consumes space that could be used for interconnects or other components. The distance between the integrated circuitry of the semiconductor die and chip capacitors or other passive devices creates design challenges and can cause large capacitive and inductive parasitics impacting device performance.

To address these limitations, the present disclosure is directed to a semiconductor package assembly in which one or more passive devices is stacked on a semiconductor die to reduce the distance between the passive device and integrated circuitry in the die.

A three-dimensional semiconductor package assembly having a stacked passive device is disclosed. The assembly includes a first die. The first die includes a first TSV and a second TSV, where the first TSV is configured to conduct current from an active surface of the first die to a back surface of the first die. The assembly also includes a first passive device coupled to the back surface of the first die such that conductive contacts of the first passive device electrically interface with the first TSV and second TSV. The first passive device is configured to receive current through the first TSV and supply current to the first die through the second TSV. In some examples, the first passive device is a chip capacitor. In some implementations, the second TSV is coupled to a power terminal in the first die for supplying power to the first die from the first passive device through the second TSV.

In some implementations, the assembly includes a second die coupled to the back surface of the first die such that conductive contacts of the second die electrically interface with a third TSV in the first die. In some variations, the second die receives current from the first passive device through the third TSV.

In some implementations, the assembly includes a second die. The second die includes a third TSV and a fourth TSV. The third TSV is configured to conduct current from an active surface of the second die to a back surface of the second die. The assembly also includes a second passive device coupled to the back surface of the second die such that conductive contacts of the second passive device electrically interface with the third TSV and fourth TSV. The second passive device is configured to receive current through the third TSV and supply current to the second die through the fourth TSV. The assembly can also include a mold layer which includes encapsulant material partially encapsulating the first die, the second die, the first passive device, and the second passive device. The assembly can also include a redistribution layer structure fabricated on the active surface of the first die, the active surface of the second die, and coplanar surfaces of the mold material. In some variations, the first passive device is coupled to an area of the back surface of the first die opposite a PHY region of the active surface of the first die and the second passive device is coupled to an area of the back surface of the second die opposite a PHY region of the active surface of the second die.

A variation of the embodiment is directed to an apparatus including a three-dimensional semiconductor package having a stacked passive device. The apparatus includes a substrate and a semiconductor package assembly mounted on the substrate. The semiconductor package assembly includes a first die that includes a first TSV and a second TSV, where the first TSV supplies power received from the substrate at an active surface of the first die to a back surface of the first die. The assembly also includes a first passive device coupled to the back surface of the first die such that conductive contacts of the first passive device electrically interface with the first and second TSVs. The first passive device receives power through the first TSV and supplies power to the first die through the second TSV. In some examples, the first passive device is a chip capacitor. In some implementations, the second TSV is coupled to a power terminal in the first die for supplying power to the first die from the first passive device through the second TSV.

In some implementations, the assembly includes a second die coupled to the back surface of the first die such that conductive contacts of the second die electrically interface with a third TSV in the first die. In some variations, the second die receives power from the first passive device through the third TSV.

In some implementations, the assembly includes a second die that includes a third TSV and a fourth TSV, where the third TSV supplies power from an active surface of the second die to a back surface of the second die. The assembly also includes a second passive device coupled to the back surface of the second die such that conductive contacts of the second passive device electrically interface with the third TSV and fourth TSV in the second die, where the second passive device receives power through the third TSV and supplies power to the second die through the fourth TSV. The assembly can also include a mold layer including encapsulant material partially encapsulating the first die, the second die, the first passive device, and the second passive device, and a redistribution layer structure fabricated on the active surface of the first die, the active surface of the second die, and coplanar surfaces of the mold material. In some variations, the first passive device is coupled to an area of the back surface of the first die opposite a PHY region of the active surface of the first die and the second passive device is coupled to an area of the back surface of the second die opposite a PHY region of the active surface of the second die.

Another variation of the embodiment is direct to a method of fabricating a three-dimensional semiconductor package having a stacked passive device. The method includes exposing multiple through silicon vias (TSVs) including a first and second TSV on a back surface of a first die, where the first TSV is configured to conduct current from an active surface of the first die to a back surface of the first die. The method also includes coupling a first passive device to the back surface of the first die such that conductive contacts of the first passive device electrically interface with the first and second TSV in the first die, where the first passive device receives current through the first TSV and supplies current to the first die through the second TSV.

In some variations, the first passive device is coupled to the first die using a hybrid bonding technique. In other variations, the first passive device is coupled to the first die using a micro-bumps fabricated on the conductive contacts.

In some implementations, the method also includes coupling a second die to the back surface of the first die such that conductive contacts of the second die electrically interface with a third TSV in the first die. In some variations, the first passive device is coupled to an area of the back surface of the first die opposite a PHY region of the active surface of the first die.

In some implementations, the method also includes exposing a third and fourth TSV on a back surface of a second die, where the third TSV is configured to conduct current from an active surface of the second die to a back surface of the second die. In these implementations, the method also includes coupling a second passive device to the back surface of the second die such that conductive contacts of the second passive device electrically interface with the third and fourth TSV in the second die, where the second passive device is configured to receive current through the third TSV and supply current to the second die through the fourth TSV.

The present disclosure will be described in further detail beginning with FIG. 1. Like reference numerals refer to like elements throughout the specification and drawings. FIG. 1 sets forth a block diagram of an example semiconductor package assembly 100 in accordance with an implementation of the present disclosure. The semiconductor package assembly 100 can be useful in high performance applications, such as, a personal computer, a notebook, a tablet, a smart phone, a storage data center, or applications involving large scale databases, or analytics, such as finance, life sciences, or artificial intelligence. Many other applications are possible.

As described below in greater detail, the example semiconductor package assembly 100 includes a passive device stacked on a die to improve the electrical performance of the die. The proximity of the passive device to the die reduces parasitic properties and provides design flexibility.

The semiconductor package assembly 100 depicted in FIG. 1 includes a first-level semiconductor die 110 upon which passive devices, dummy components, or other dies may be stacked. The first-level die 110 is formed from a semiconducting substrate 102, such as silicon, silicon-on-insulator, gallium arsenide, silicon-germanium, or the like, having back surface 106 and an opposing device layer 104. A device layer integrated circuitry 112 is formed on or within the device layer 104. Device layers are typically fabricated by sequentially depositing insulating or dielectric layers, conductive layers, and semiconductive layers of material over the semiconductor bulk, and patterning the various material layers using photolithography and photo-masking to form circuit components and elements (e.g., transistors, capacitors, resistors, etc.). The circuit components are connected to form integrated circuits that implement a functional circuit block of the die.

The first-level die 110 also includes an interconnection layer 122 formed on the semiconducting substrate device layer 104. The die interconnection layer 122 can be a back end of line (BEOL) layer. The die interconnection layer forms electrical connections between bond pads 124 and the device layer integrated circuitry 112. The bond pads 124 are formed in or on the die interconnection layer 122.

The die interconnection layer 122 can be constructed of alternating dielectric layers and patterned conductive trace layers (not shown) connected with conductive vias extending through the dielectric layers, as will be understood by those skilled in the art. The patterned conductive traces can be any appropriate conductive material, including but not limited to, copper, aluminum, silver, gold, alloys thereof, and the like. The dielectric layers can be any appropriate dielectric material, including but not limited to, silicon dioxide and silicon oxynitride. In this way, the first-level die 110 includes an active surface 128 (e.g., an external surface of the die interconnect layer 122) and an opposing back surface 106. The active surface 128 is the surface of the die 110 opposite the substrate 102 and includes interconnects such as the bond pads 124 for connection to other components. In some examples, the active surface 128 is the lowest layer of the interconnect layer 122.

As further illustrated in FIG. 1, a plurality of through-silicon vias 132 are formed from the die back surface 106 to either the device layer integrated circuitry 112 or through the device layer integrated circuitry 112 to the die interconnection layer 122 to form electrical routes therebetween. The techniques and processes for forming the TSVs 132 are well known in the art including etching or drilling (such as by laser) vias into the semiconductor substrate 102 and/or the device layer integrated circuitry 112. The TSVs are also formed by disposing a conductive material, including but not limited to, copper, aluminum, silver, gold, alloys thereof and the like, within the vias. The conductive material can be formed by any known techniques including but not limited to deposition and plating techniques.

The TSVs 132 can be "via-first" TSVs that are fabricated before devices in a device layers (transistors, capacitors, resistors, etc.) are patterned. In other variations, the TSVs 132 can be "via-middle" TSVs that are fabricated after the individual devices are patterned but before the die interconnection layer 122 is created. In still further variations, the TSVs 132 can be "via-last" TSVs that are fabricated after (or during) the fabrication of the die interconnection layer 122. After formation, the TSVs 132 are selectively filled or plated with conductive material (e.g., copper) to create interconnects. The TSVs 132 in FIG. 1 are metal insulator semiconductor (MIS) devices in which a dielectric layer is deposited for the electrical isolation between the conducting metal and silicon substrate. The TSVs 132 are buried, such that the bulk of the substrate must be ground or etched away to expose the TSV. Readers will appreciate that the TSVs 132 provide high density, short channel, wide interconnects useful for die partitioning and die stacking. Readers will also appreciate that, although commonly referred to a "through-silicon" via, a TSV can be any via that connects the die active surface 128 or device layer integrated circuitry 112 to the back surface 106 regardless of the material of the substrate. The number of TSVs illustrated are for explanation only, and readers of skill in the art will appreciate that there can be more or fewer TSVs than illustrated.

The first-level die 110 also includes a plurality of conductive interconnects 170 (e.g., die pads, microbumps, controlled collapse chip connection (C4) bumps, etc.) electrically coupled to bond sites on the active surface 128 of the die interconnection layer 122. The active surface 128 can include a passivation layer (e.g., silicon nitride) disposed thereon to protect the die, which can be etched to expose the bonding sites. The interconnects 170 can be fabricated on or attached to the bonding sites through various well-known techniques. In some examples, an under-bump metallization layer (not shown) is fabricated on the bonding site prior to attachment of the interconnects 170 to improve mechanical and electrical coupling. Various interconnects 170 provide power and ground to the first-level die 110 and convey input and output signals.

In FIG. 1, the semiconductor package assembly 100 is mounted on a substrate 150. The interconnects 170 align with bonding sites on the surface of the substrate 150. Power and ground are supplied from the substrate 150 to the first-level die 110. Input and output signals are conveyed between the first-level die 110 and the substrate 150 through the interconnects 170.

In some examples, a metal layer (not shown) that includes conductive traces and conductive bond sites is fabricated on the back surface of the first-level die 110 to provide electrical routing to the TSVs 132. The bond sites receive conductive interconnects of passive devices or second-level dies that are bonded to the back surface 106 of the first-level die 110. In some examples, the bond sites include bond pads.

The example semiconductor package assembly 100 depicted in FIG. 1 also includes a second-level, or 'stacked,' passive device 140. The passive device 140 is bonded to the back surface 106 of the first-level die and is therefore referred to as a second-level component of a 3D package architecture. The passive device 140 includes interconnects 142 (e.g., solder structures or bond pads) that are be bonded directly to two or more TSVs 132 or bonded to bond sites that are connected to TSVs 132 through conductive traces on the back surface 106 of the first-level die 110. A solder reflow process is employed to create the bond. In other examples, a hybrid bonding technique may be employed to create the bond.

The passive device 140 in the example of FIG. 1 is a capacitor. Such passive devices 140 can also be implemented as resistors, inductors, and so on. More specifically, the passive device 140 is a decoupling capacitor provided to reduce power supply and switching noise in the first-level die 110. At least one first TSV 132 in the first-level die 110 is electrically coupled to an interconnect 170 (through a bond pad 124) and carries power from the substrate 150 to the decoupling capacitor/passive device 140. The power is stored as energy in the capacitor and eventually supplied to the first-level die 110 through at the second TSV 132.

The second TSV 132 is connected to one or more power terminals 144 (e.g., connected to a power rail, power bus, or power mesh) within the first-level die 110 for delivering power to the device layer integrated circuitry 112. In FIG. 1, the power terminals 144 are included within the interconnection layer 122, but other variations are possible. For example, in another variation, the power terminal 144 can be provided in the device layer.

The example semiconductor package assembly includes an encapsulant layer (not shown) encasing the first-level die 110 and the passive device 140. In one example, the encapsulant layer is an epoxy or other polymer material. In another example, the encapsulant layer is silicon dioxide, thus having a coefficient of thermal expansion (CTE) that is closer to that of the first-level die 110. Underfill material (not shown) is deposited between the first-level die 110 and the substrate 150 to encase and protect the interconnects 170. In some examples, the underfill material is deposited between the passive device 140 and the first-level die 110 to encase and protect the interconnects 142.

For further explanation, FIGS. 2-5 set forth an exemplary process flow for fabricating the semiconductor package assembly according to various implementations. For example, the exemplary process flow set forth in FIGS. 2-4 may be used to construct the example semiconductor package assembly 100 depicted in FIG. 1. Beginning with FIG. 2, a first level die 210 (e.g., the first level die 110 of FIG. 1) is placed on a carrier 250. The first-level die 210 includes a substrate portion 202, TSVs 232 buried in the substrate portion 202, and interconnection layer 222 including bond pads 224 of the active surface 228. At least one TSV 232 is coupled to a bond bad 224 and at least one TSV is coupled to a power terminal 244 in the first-level die 210. Prior to placing the first-level die 210, the attachment surface of the carrier 250 can be treated with a heat or light-activated release layer for eventual detachment of the carrier 250. The carrier 250 can be glass carrier or another suitable material.

Figure 3:
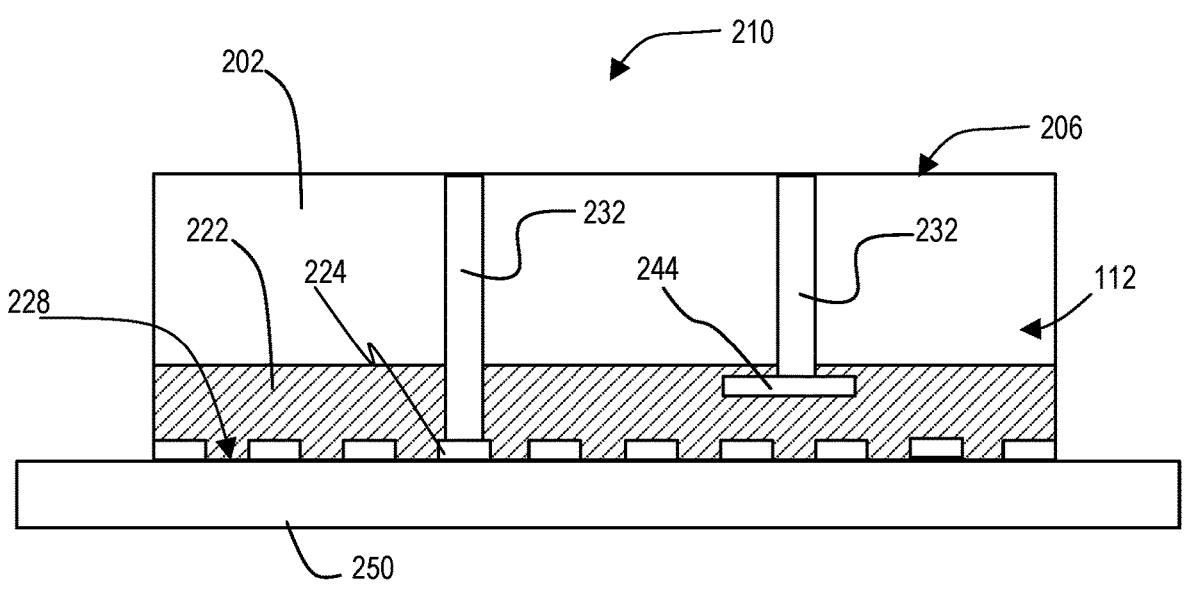
FIG. 3 is another portion of the example process flow for fabricating a three-dimensional semiconductor package having a stacked passive device according to some implementations.

Moving to FIG. 3, the first-level die 210 undergoes a thinning and planarization process to remove (e.g., by grinding) bulk material of the substrate portion 202 from the back surface 206 of the die 210 to expose buried TSVs 232. Alternatively, thinning is not required or has been performed prior to placing the first-level die 210 on the carrier 250. In some examples, the TSVs are plated or filled with a conductive material (e.g., copper). The back surface of the first-level die can be prepared to receive a passive device (or other second-level components), for example, by depositing a metallization layer to facilitate connection of the TSVs 232 to interconnects (e.g., solder structures) of the second-level component.

Figure 4A:
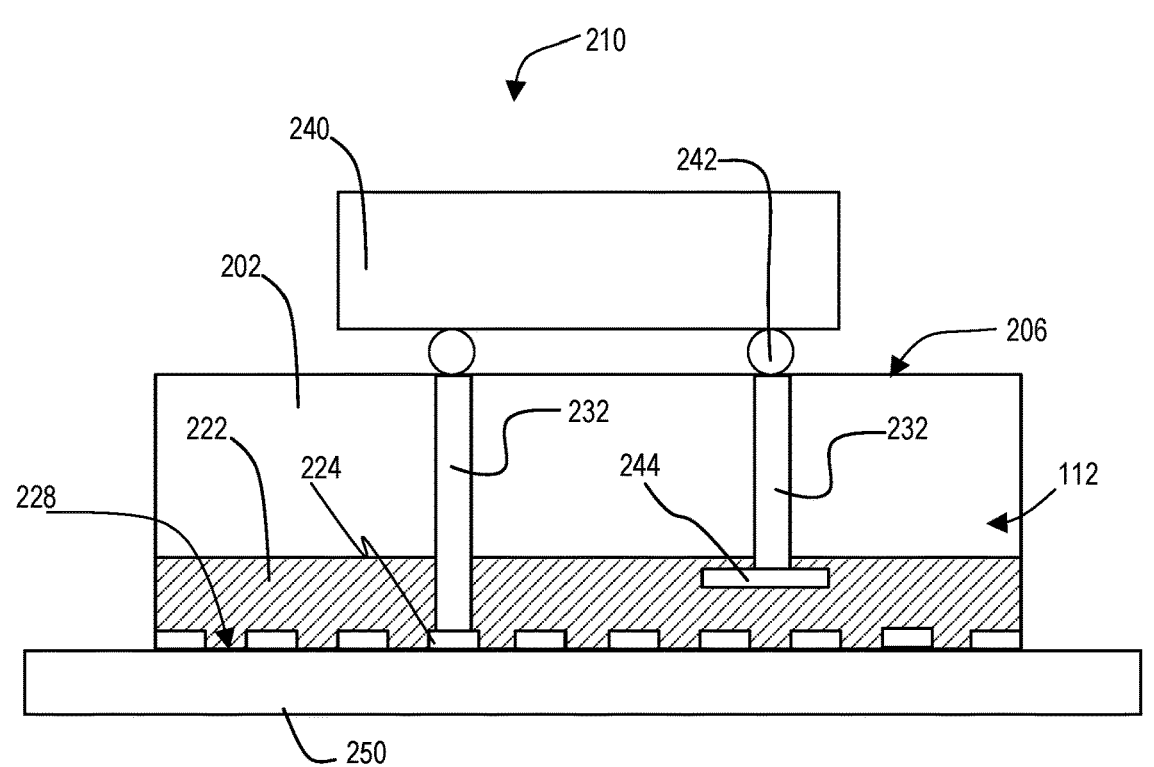
FIG. 4A and FIG. B depict alternative portions of the example process flow for fabricating a three-dimensional semiconductor package having a stacked passive device according to some implementations.

Moving to FIG. 4A, a passive device 240 is placed on the back surface 206 of the first-level die 210. The passive device 240 is placed such that interconnects 242 (e.g., microbumps) of the passive device 240 align with bonding sites on the back surface 206 of the first-level die 210. The bonding sites can be bonding pads formed directly over the TSVs 232 or can be bonding pads connected to the TSVs 232 through conductive traces formed the back surface 206 of the first-level die 210. In some examples, a solder reflow process is used to bond the passive device 240 to the first-level die 210.

Figure 4B:
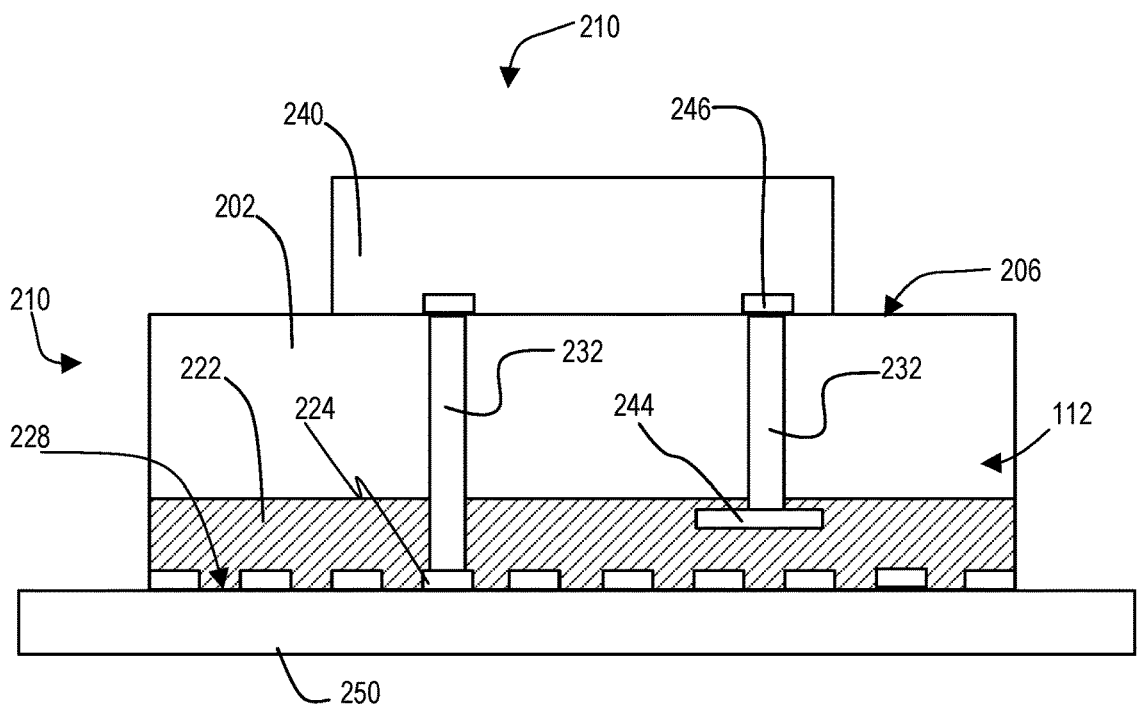

FIG. 4B illustrates an alternative to the process flow depicted in FIG. 4A. In FIG. 4B the passive device 240 is placed such that recessed bond pads 246 of the passive device 240 align with bonding sites on the back surface 206 of the first-level die 210 corresponding to TSVs 132. In these examples, a hybrid bonding process is used to bond the passive device 240 to the first-level die 210.

Figure 5:
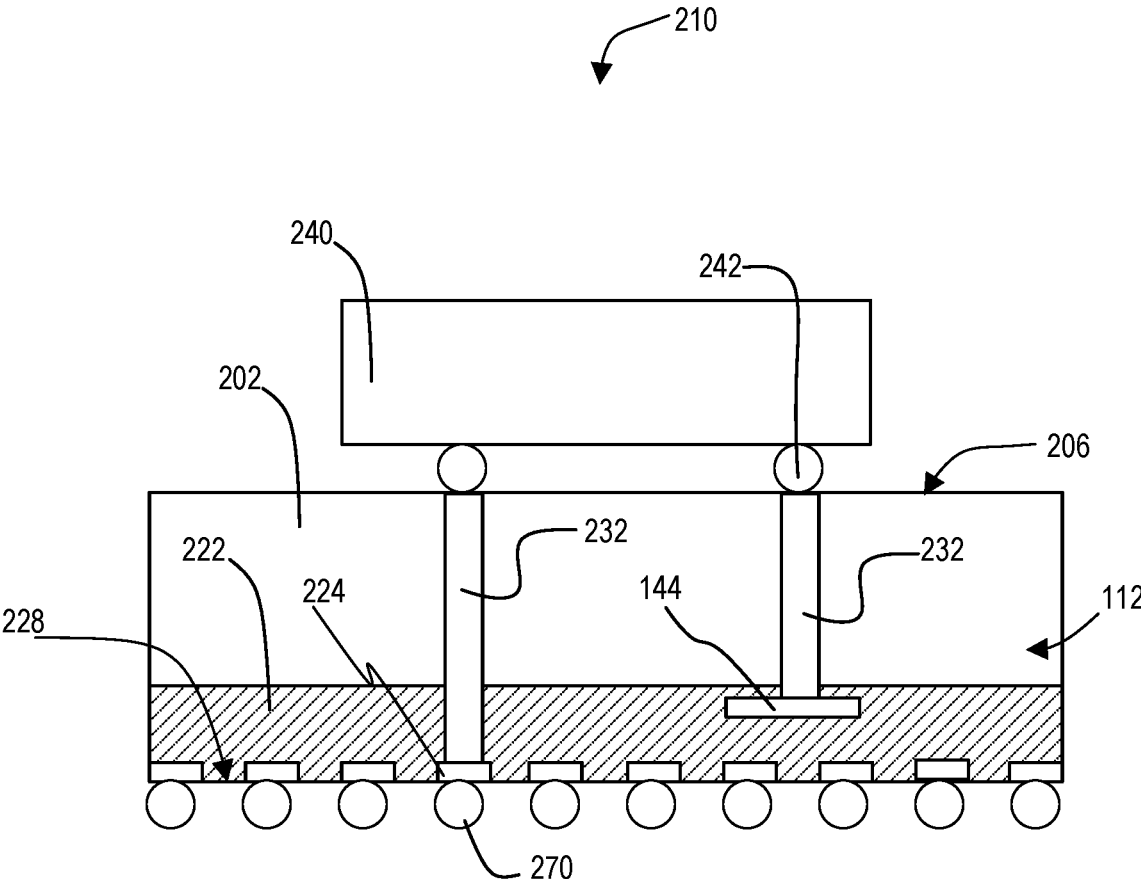
FIG. 5 is another portion of the example process flow for fabricating a three-dimensional semiconductor package having a stacked passive device according to some implementations.

Moving to FIG. 5 from either of FIG. 4A or 4B, the carrier 250 is removed activating a release layer. Interconnects 270 (e.g., solder balls) are attached to the active surface 228 of the first-level die. Some of the interconnects 270 are electrically coupled to TSVs 232. In some examples, an under-bump metallization process is performed over bond sites and surrounding portions of a passivation layer on the active surface 228 of the die to improve mechanical and electrical coupling between the first-level die 210 and the interconnects 270.

Figure 6:
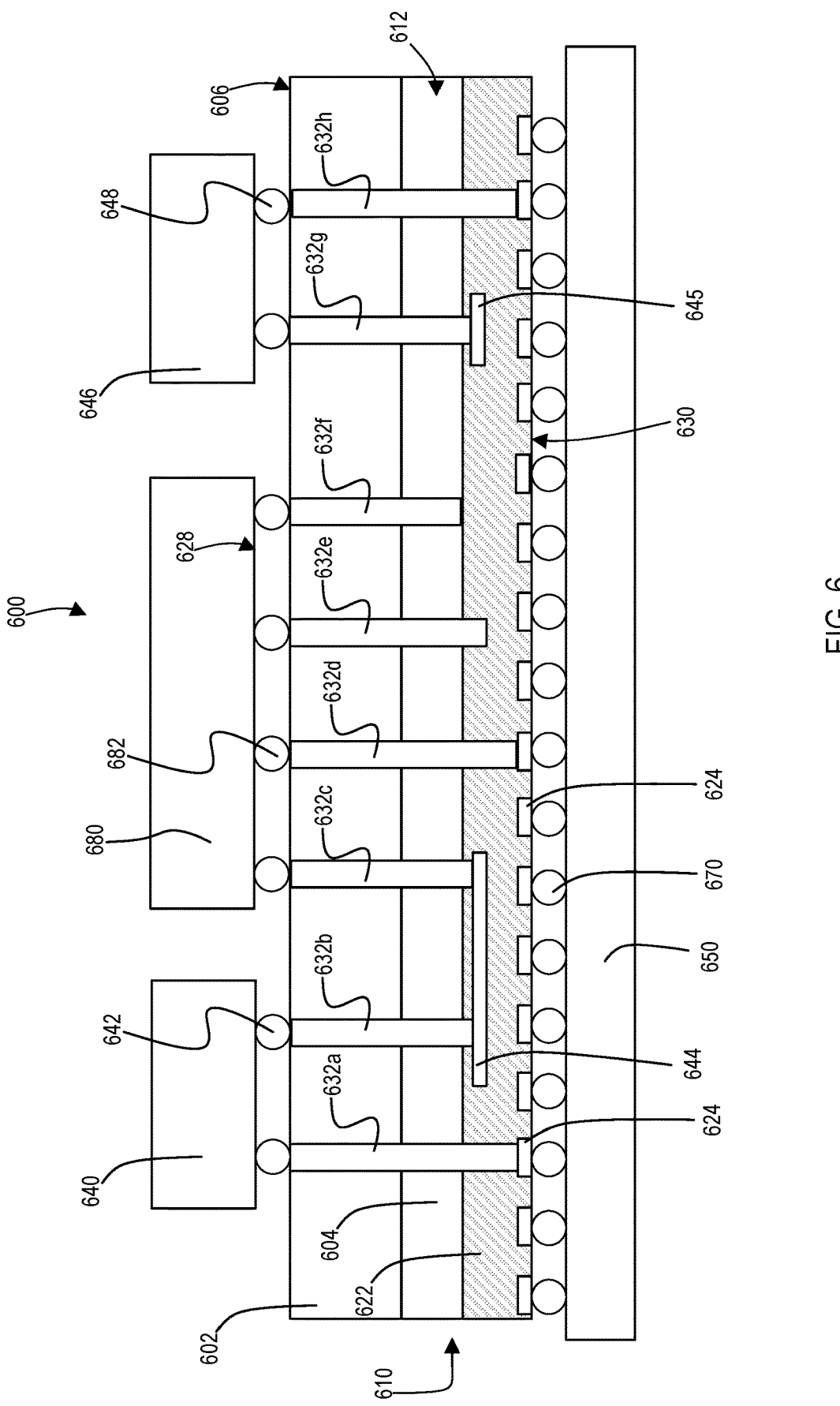
FIG. 6 sets forth a cross section block diagram of another example three-dimensional semiconductor package having a stacked passive device according to some implementations of the present disclosure.

For further explanation, FIG. 6 sets forth a block diagram of another example semiconductor package assembly 600 in accordance with some implementations. The semiconductor package assembly 600 includes a first-level die 610 that includes similar features as the first-level die 110 of FIG. 1. Namely, FIG. 6 includes TSVs 632*a-h*, a back surface 606 of a substrate 602, an active surface 630, an interconnection layer 622, a device layer 604 including device layer integrated circuitry 612, and one or more power terminals 644

(e.g., connected to a power rail, power bus, or power mesh) within the first-level die 610 for delivering power to the device layer integrated circuitry 612. The number of TSVs illustrated are for explanation only, and readers of skill in the art will appreciate that there may be more TSVs than illustrated.

The semiconductor package assembly 600 also includes a number of external interconnects 670 electrically and mechanically coupled to the active surface 630 of the first-level die 610. The external interconnects 670 are used to provide power and ground to the semiconductor package assembly 600 from an external component such as substrate 650.

The semiconductor package assembly 600 also includes passive devices 640, 646 bonded to the back surface 606 of the first-level die 610 as described above. As such, the passive devices 640, 646 are second-level components of a 3D package architecture. The passive device 640, 646 include interconnects 642, 648 (e.g., microbumps or bond pads) that are bonded directly to TSVs (i.e., TSVs 632*a*, 632*b*, 632*g*, 632*h*), or bonded to two or more bond sites connected to TSVs (i.e., TSVs 632*a*, 632*b*, 632*g*, 632*h*) through conductive traces on the back surface 606 of the first-level die 610. It will be appreciated the passive devices 640, 646 can be electrically coupled to more or fewer TSVs than those illustrated. The interconnects 642, 648 can be solder structures for metallurgical bonding (e.g., solder reflow) or recessed bond pads for hybrid bonding. In various examples, the passive devices 640, 646 are capacitors, resistors, inductors, or combinations thereof.

The semiconductor package assembly 600 also includes at least one stacked die 680 bonded to the back surface 606 of the first-level die 610. As such, the stacked die 680 is a second-level components of a 3D package architecture. The stacked die 680 includes similar features to the first-level die 610 such as a substrate, device layer integrated circuitry, an interconnection layer (all not shown for ease of illustration). The stacked die 680 is not directly connected to the external interconnects 670 that convey input signals, output signals, power, and ground. Rather, the input signals, output signals, power, and ground to and from the stacked die 680 are conveyed through the TSVs 632*c*, 632*d*, 632*e*, 632*f* of the first-level die 610.

The stacked die 680 includes interconnects 682 for bonding to the back surface 606 of the first-level die 610. The interconnects 682 can be solder structures for metallurgical bonding (e.g., solder reflow) or recessed bond pads for hybrid bonding. When present, the recessed bond pads can be coplanar with an active surface 628 of the stacked die 680 and composed of a conductive metal such as copper. The interconnects 682 of the stacked die 680 can be bonded directly to TSVs (i.e., TSVs 632*c*, 632*d*, 632*e*, 632*f*), or bonded to two or more bond sites connected to TSVs (i.e., TSVs 632*c*, 632*d*, 632*e*, 632*f*) through conductive traces on the back surface 606 of the first-level die 610. It will be appreciated that the stacked die 680 can be electrically coupled to more or fewer TSVs than those illustrated.

The passive devices 640, 646 include capacitors that supply filtered power to the first-level die 610 as discussed above. The passive devices 640, 646 also supply power to the stacked die 680. In the example arrangement depicted in FIG. 6, the passive device 640 receives power from the substrate 650 through a pathway including an interconnect 670, a bond pad 624, TSV 632*a*, and an interconnect 642. The passive device 640 supplies power to a power terminal 644 in the first-level die 610 through TSV 632*b*. The stacked die 680 receives power from the passive device 640 through a pathway that includes the power terminal 644 in the first-level die 610, the TSV 632c that is electrically coupled to the power terminal 644, and an interconnect 682. The stacked die 680 receives ground from the substrate 650 through the TSV 632d in the first-level dies 610. The stacked die 680 conveys input/output signals through two or more TSVs 632e, 632f that are electrically coupled to the interconnection layer 622 in the first-level die 610. The passive device 646 receives power from the substrate 650 through an interconnect 670 and TSV 632h. The passive device 640 supplies power to another power terminal 645 in the first-level die 610 through TSV 632g.

The semiconductor package assembly 600 also includes an encapsulant layer (not shown) encasing the first-level die 610, the stacked die 680, and the passive devices 640, 646. In one example, the encapsulant layer is an epoxy or other polymer material. In another example, the encapsulant layer is silicon dioxide, thus having a CTE that is closer to that of the first-level die 610.

Figure 7:
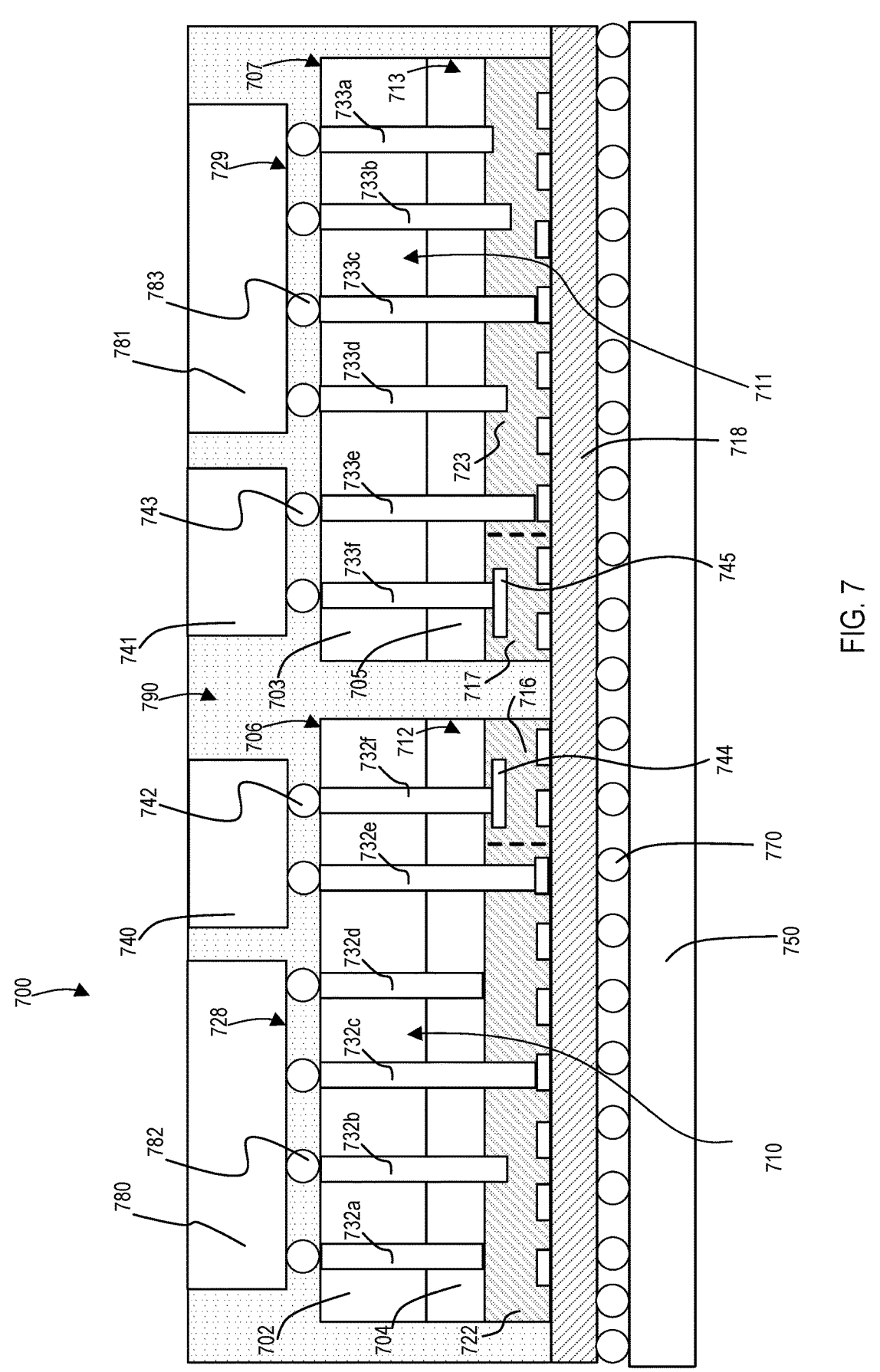
FIG. 7 sets forth a cross section block diagram of another example three-dimensional semiconductor package having a stacked passive device according to some implementations of the present disclosure.

For further explanation, FIG. 7 sets forth a block diagram of another example semiconductor package assembly 700 in accordance with some implementations. The semiconductor package assembly 700 includes multiple first-level dies 710, 711. The first-level die 710 includes TSVs 732a-f, a back surface 706 of a substrate 702, an active surface 728, an interconnection layer 722, a device layer 704 including device layer integrated circuitry 712, and one or more power terminals 744 (e.g., connected to a power rail, power bus, or power mesh) within the first-level die 710 for delivering power to the device layer integrated circuitry 712. In addition, the first-level die 711 includes TSVs 733a-f, a back surface 707 of a substrate 703, an active surface 729, an interconnection layer 723, a device layer 705 including device layer integrated circuitry 713, and one or more power terminals 745 (e.g., connected to a power rail, power bus, or power mesh) within the first-level die 711 for delivering power to the device layer integrated circuitry 713. The illustrated number of TSVs of either first-level die 710, 711 are for explanation only, and readers of skill in the art will appreciate that there may be more or fewer TSVs than illustrated.

The first-level dies 710, 711 also include a physical device or "PHY" region 716, 717, and a non-PHY region. The PHY region has various internal and external conductor structures dedicated to the transmission of die-to-die signals. The non-PHY region has conductor structures that are tailored to the conveyance of power, ground, or die-to-substrate signals. The PHY region 716, 717 includes die pads for input/output signals to implement electrical pathways between the first-level dies 710, 711. In some examples, the die pads in these PHY regions 716, 717 have a finer pitch than other die pads of the non-PHY regions of the first-level dies. The PHY 716, 717 is fabricated at the periphery of each of the first-level dies 710, 711, which are placed such that these PHY regions 716, 717 are proximate to one another to reduce the distance between the two PHY regions 716, 717.

The semiconductor package assembly 700 also includes a number of external interconnects 770 electrically and mechanically coupling the semiconductor package assembly 700 to an external component such as a substrate 750. In an implementation, the substrate 750 is a printed circuit board (PCB). The external interconnects 770 are used to provide power and ground to the semiconductor package assembly 700 from the substrate 750. The conductive external interconnects may be conductive structures such as die pads, microbumps, C4 bumps, or other solder structures.

The semiconductor package assembly 700 also includes at least one passive device 740 bonded to the back surface 706 of the first-level die 710 and at least one passive device 741 bonded to the back surface 707 of the other first-level die 711. As such, the passive devices 740, 741 are second-level components of a 3D package architecture. The passive device 740 includes interconnects 742 that are bonded directly to TSVs (i.e., TSVs 732e, 732f), or bonded to two or more bond sites connected to TSVs (i.e., TSVs 732e, 732f) through conductive traces on the back surface 706 of the first-level die 710. The passive device 741 includes interconnects 743 (e.g., microbumps or bond pads) that are bonded directly to TSVs (i.e., TSVs 733e, 733f), or bonded to two or more bond sites connected to TSVs (i.e., TSVs 733e, 733f) through conductive traces on the back surface 707 of the first-level die 711. It will be appreciated the passive devices 740, 741 can be electrically coupled to more or fewer TSVs than those illustrated. The interconnects 742, 743 can be solder structures for metallurgical bonding (e.g., solder reflow) or recessed bond pads for hybrid bonding, as discussed above. In various examples, the passive devices 740, 741 can be capacitors, resistors, inductors, or combinations thereof. The passive devices 740, 741 are placed on the back surfaces 706, 707 of the first-level dies 710, 711 opposite the respective PHY regions 716, 717 to reduce the distance between the passive devices 740, 741 and the die pads that implement die-to-die connections.

The semiconductor package assembly 700 also includes a stacked die 780 bonded to the back surface 706 of the first-level die 710 and a stacked die 781 bonded to the back surface 707 of the other first-level die 711. As such, the stacked dies 780, 781 are second-level components of a 3D package architecture. The stacked die 780 includes interconnects 782 for bonding to the back surface 706 of the first-level die 710. The stacked die 781 includes interconnects 783 for bonding to the back surface 707 of the first-level die 711. The interconnects 782, 783 can be solder structures for metallurgical bonding (e.g., solder reflow) or recessed bond pads for hybrid bonding. When present, the recessed bond pads can be coplanar with an active surface 728, 729 and composed of a conductive metal such as copper.

The interconnects 782 of the stacked die 780 are bonded directly to TSVs (i.e., TSVs 732a, 732d, 732c, 732d), or bonded to two or more bond sites connected to TSVs (i.e., TSVs 732a, 732d, 732c, 732d) through conductive traces on the back surface 706 of the first-level die 710. The interconnects 783 of the stacked die 781 are bonded directly to TSVs (i.e., TSVs 733a, 733d, 733c, 733d), or bonded to two or more bond sites connected to TSVs (i.e., TSVs 733a, 733d, 733c, 733d) through conductive traces on the back surface 707 of the first-level die 711. It will be appreciated the stacked die 780, 781 can be electrically coupled to more or fewer TSVs than those illustrated.

The example semiconductor package assembly 700 depicted in FIG. 7 also includes an encapsulant material 790 encasing the first-level dies 710, 711, the stacked dies 780, 781, and the passive devices 740, 741. In one example, the encapsulant material 790 is an epoxy or other polymer material. In another example, the encapsulant layer is silicon dioxide, thus having a CTE that is closer to that of the first-level dies 710, 711.

The semiconductor package assembly 700 also includes a redistribution layer 718 that implements the electrical pathways between the PHY regions 716, 717 of the first-level dies 710, 711. The redistribution layer 718 also implements electrical pathways between other die pads on the active surfaces 728, 729 of the first-level dies and interconnects 770 on a land side surface of the redistribution layer. The redistribution layer 718 is fabricated on the active surfaces 728, 729 of the first-level dies 710, 711 and on the encapsulant material 790 that is coplanar with the active surfaces 728, 729. The redistribution layer 718 forms fan-out pathways from the active surfaces 728, 729 of the first-level dies 710, 711 extending beyond these surfaces to the coplanar surfaces of the encapsulant material 790. The redistribution layer 718 can include multiple layers of conductor structures (not shown), such as traces, pads, vias and other types of conductor structures suitable for fabrication, and multiple interlevel dielectric layers (not shown). In various examples, the conductor structures can be constructed of copper, aluminum, gold, platinum, palladium, combinations of such or other conductors, and be fabricated using well-known material deposition techniques, such as, plating, sputtering, chemical vapor deposition, combinations of these or the like and patterned as necessary using well-known photolithography and directional etching techniques. The interlevel dielectric layers can be constructed of glass(es) such as silicon oxide or other types of interlevel dielectric layer materials. The external interconnects are mechanically and electrically coupled to bond pads in the redistribution layer 718. The redistribution layer 718 can implement a tight pitch integrated fan-out interconnection between the PHY region 716 of the first-level die 710 and the PHY region 717 of the other first-level die 711.

In some implementations, the passive devices 740, 741 include capacitors that supply filtered power to the first-level dies 710, 711 respectively. The passive devices 740, 741 also supply filtered power to the stacked dies 780, 781 respectively. In the example arrangement depicted in FIG. 7, the passive device 740 receives power from the substrate 750 through an interconnect 770, the redistribution layer 718, and TSV 732e. The passive device 740 supplies power to a power terminal 744 in the first-level die 710 through TSV 632f. In some implementations, the stacked die 780 receives power from the passive device 740 through TSV 632d and an electrical pathway to power terminal 744, or through another electrical pathway that includes TSV 632d and a different power terminal (not shown) electrically coupled to the passive device 740. In other implementations, the stacked die 780 receives power from the substrate through a TSV, the redistribution layer 718, and an interconnect 770. The stacked die 780 receives ground from the substrate 750 through the TSV 732c in the first-level die 710. The stacked die 780 conveys input/output signals through TSVs 732a, 732b that are electrically coupled to the interconnection layer 722 in the first-level die 710.

Similarly, the passive device 741 receives power from the substrate 750 through an interconnect 770, the redistribution layer 718, and TSV 733e. The passive device 741 supplies power to a power terminal 745 in the first-level die 711 through TSV 733f. In some implementations, the stacked die 781 receives power from the passive device 741 through TSV 733d and an electrical pathway to power terminal 745 or through another electrical pathway that includes TSV 733d and another power terminal (not shown) electrically coupled to the passive device 741. In other implementations, the stacked die 781 receives power from the substrate through a TSV, the redistribution layer 718, and an interconnect 770. The stacked die 781 receives ground from the substrate 750 through the TSV 733c in the first-level die 711. The stacked die 781 conveys input/output signals through TSVs 733a, 733b that are electrically coupled to the interconnection layer 723 in the first-level die 711.

Figure 8:
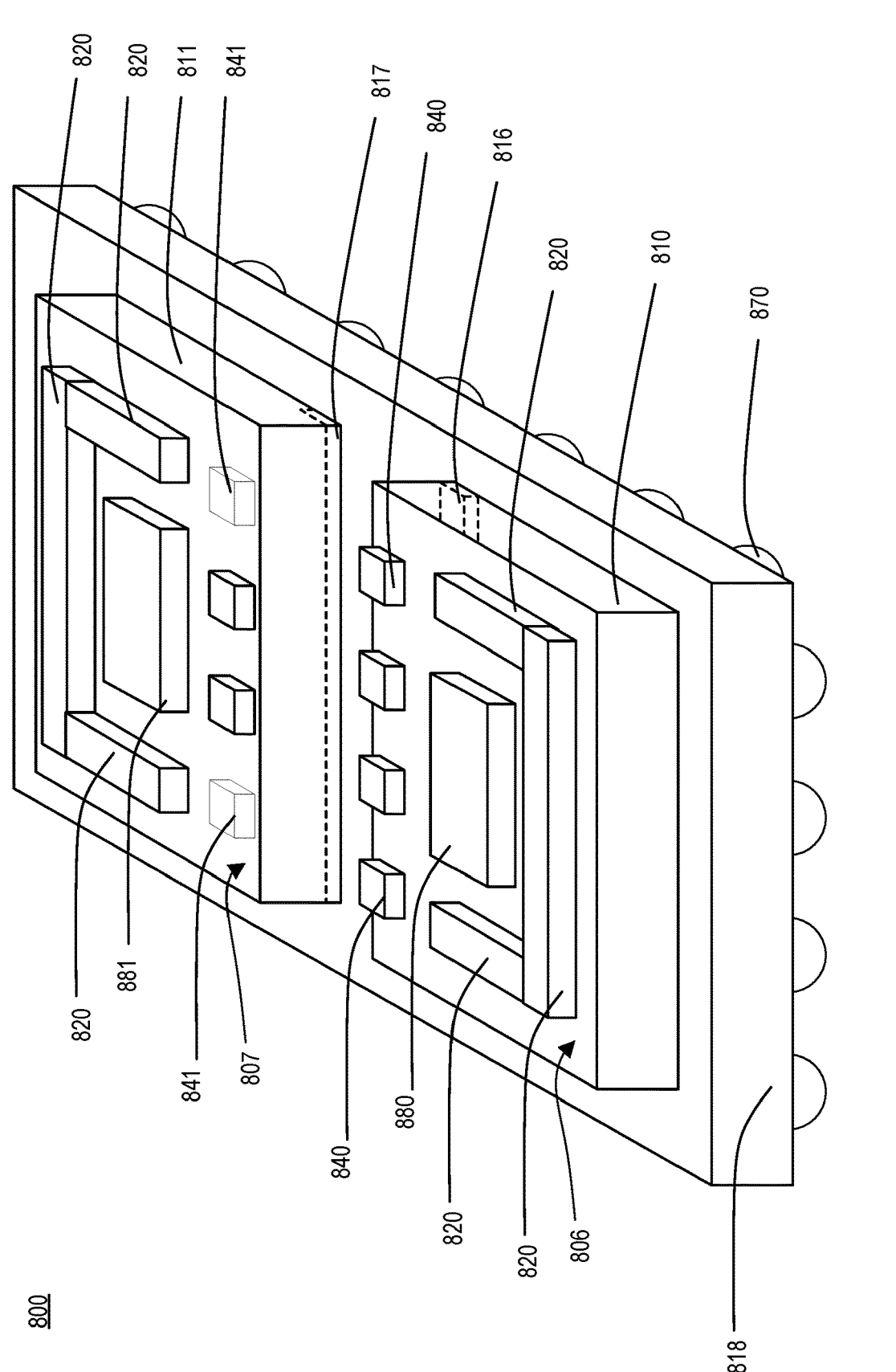
FIG. 8 sets forth a perspective block diagram of another example three-dimensional semiconductor package having a stacked passive device according to some implementations of the present disclosure.

For further explanation, FIG. 8 sets forth a perspective view block diagram of another example semiconductor package assembly 800 in accordance with some implementations. Conventionally, inactive (or 'dummy') components are stacked on a first-level die among other stacked active components (e.g., a second-level die) to provide structural support for the semiconductor package. The dummy components can be, for example, bulk silicon that has a CTE similar to that of the first-level die. As one example, dummy components can be placed beside or around a second-level die. In accordance with some implementations, some or all of the dummy components can be replaced with passive devices.

In the example of FIG. 8, some or all of the dummy components are replaced with passive devices are stacked on first-level dies. The semiconductor package assembly 800 includes a stacked die 880 bonded to a back surface 806 of a first level die 810 and a stacked die 881 bonded to a back surface 807 of another first-level die 811. Dummy components 820 are also attached to the back surfaces 806, 807 of the first-level dies 810, 811 around the stacked dies 880, 881 to provide structural support to the package. In the example of FIG. 8, instead of dummy components, passive devices 840, 841 are bonded to the back surfaces 806, 807 of the first-level dies 810, 811 respectively. In this example, the passive devices 840, 841 are placed proximate to the PHY regions 816, 817 (partially denoted by the dashed line) of the first-level dies 810, 811. The first-level dies 810, 811, the stacked dies 880, 881, and the passive devices 840, 841 include the same or similar features as illustrated in any of FIGS. 1-7 as described above. The first-level dies 810, 811, the stacked dies 880, 881, and the passive devices 840, 841 can be encased in an encapsulant material not depicted here for clarity of illustration. A redistribution layer 818 is fabricated on the active surfaces of the first-level dies 810, 811 and coplanar surfaces of the encapsulant material. External interconnects 870 are attached to the redistribution layer 818 for providing power and ground, and for conveying I/O signals, from components external to the semiconductor package assembly 800.

For further explanation, FIG. 9 sets forth a flow chart illustrating an example method for fabricating a three-dimensional semiconductor package having a stacked passive device. The method of FIG. 9 includes exposing 902 multiple through silicon vias (TSVs) on a back surface of a first die. A first TSV among a first plurality of the TSVs supplies power from an active surface of the first die to a back surface of the first die. Exposing 902 multiple TSVs on a back surface of a first die is carried out by placing a first-level bottom die on a carrier and removing bulk material from the back surface of a substrate of the bottom die. The back surface is the surface opposite the active surface. Bulk material is removed, for example, by grinding, to expose TSVs buried in the bottom die. The TSVs provide an electrical pathway from the back surface into the bottom die. The TSVs can terminate at a device layer that include integrated circuitry such as transistors, capacitors, or resistors. The TSVs can also terminate at an interconnection layer that includes layers of metallization (e.g., conductive traces, pads, and via) and dielectric material that provide electrical signal pathways among functional logic blocks of the die and to die pad interconnects for receiving power, ground, and conveying I/O signals to external components such as a substrate or redistribution layer. The TSVs can also terminate at the active surface of the die where die pads interface with an external component such as a substrate. At least one TSV provides an electrical pathway to supply power from the active surface of the bottom die to the back surface of the bottom die.

The method of FIG. 9 also includes coupling 904 a first passive device to the back surface of the first die such that conductive contacts of the first passive device electrically interface with the first plurality of the TSVs in the first die. The first passive device receives power through the first TSV and supplies power to the first die through a second TSV among the first plurality of TSVs. Coupling 904 the first passive device to the back surface of the first die is carried out by creating a metallurgical or hybrid bond between the passive device and the back surface (opposite the active surface that includes the interconnection layer) of the first die.

Electrical contacts of the passive device are bonded to a first group of TSVs that includes the TSV supplying power to the passive device. In some examples, a conductive traces and bond pads are formed on the back surface of the bottom die. In these examples, electrical contacts of the passive device are bonded to bond pads that are electrically coupled to the first group of TSVs through these conductive traces. At least one of the electrical contacts of the passive device is electrically coupled to the TSV in the first group of TSVs that supplies power to the passive device. At least one other TSV in the first group of TSVs is connected to a power terminal within the first die (e.g., in an interconnection layer proximate the active surface of the die) for supplying power from the passive device to the die. The passive device can include a capacitor, resistor, inductor, or combinations thereof. The electrical contacts can be recessed die pads for hybrid bonding or die pads electrically and mechanically coupled to conductive interconnects (e.g., microbumps) for metallurgical bonding. In some examples, the passive device is stacked on the back surface of the bottom die opposite a PHY region on the active surface of the bottom die, as discussed above.

For further explanation, FIG. 10 sets forth a flow chart illustrating another example method for fabricating a three-dimensional semiconductor package having a stacked passive device. The method of FIG. 10 adds to the method of FIG. 9 in that the method of FIG. 10 also includes coupling 1002 a second die to the back surface of the first die such that conductive contacts of the second die electrically interface with a second plurality of the TSVs in the first die. Coupling 1002 the second die to the back surface of the first die is carried out by creating a metallurgical or hybrid bond between the stacked second die and the back surface (opposite the active surface that includes the interconnection layer) of the bottom die. Interconnects of the stacked die are bonded to a second group of TSVs. In some examples, conductive traces and bond pads are formed on the back surface of the bottom die. In these examples, interconnects of the stacked die are bonded to bond pads that are electrically coupled to the second group of TSVs through these conductive traces. In various implementations, the interconnects are recessed bond pads that are coplanar with the active surface of the die for hybrid bonding or die pads formed on the active surface that are electrically and mechanically coupled to conductive interconnects (e.g., microbumps) for metallurgical bonding. The second group of TSVs provide, at least, a pathway for I/O signals between the stacked die and the bottom die.

For further explanation, FIG. 11 sets forth a flow chart illustrating a variation of the method of FIG. 9. The method of FIG. 11 includes exposing 1102 multiple TSVs on a back surface of a second die. A third TSV among a second plurality of the TSVs supplies power from an active surface of the second die to a back surface of the second die. Exposing 1102 multiple TSVs on a back surface of a second die is carried out by placing a second bottom die on the carrier with the first bottom die and removing bulk material from the back surface of a substrate of the first and second bottom die in the same process. The back surface is the surface opposite the active surface.

Bulk material is removed by, for example, grinding to expose TSVs buried in the second bottom die. The TSVs provide an electrical pathway from the back surface into the second bottom die. TSVs can terminate at a device layer that include integrated circuitry such as transistors, capacitors, or resistors. TSVs can also terminate at an interconnection layer that includes layers of metallization (e.g., conductive traces, pads, and via) and dielectric material that provide electrical signal pathways among functional logic blocks of the die and to die pad interconnects for receiving power, ground, and conveying I/O signals to external components such as a substrate or redistribution layer. TSVs can also terminate at the active surface of the die where die pads interface with an external component such as a substrate. At least one TSV provides an electrical pathway supplying power from the active surface of the second bottom die to the back surface.

The method of FIG. 11 also includes coupling 1104 a second passive device to the back surface of the second die such that conductive contacts of the second passive device electrically interface with the second plurality of the TSVs in the second die. The second passive device receives power through the third TSV and supplies power to the second die through a fourth TSV among the second plurality of TSVs. Coupling 1104 the second passive device to the back surface of the second die is carried out by creating a metallurgical or hybrid bond between the second passive device and the back surface (opposite the active surface of the interconnection layer) of the second bottom die. Electrical contacts of the second passive device are bonded to a second group of TSVs of the second bottom die. In some examples, conductive traces and bond pads are formed on the back surface of the second bottom die. In these examples, electrical contacts of the second passive device are bonded to bond pads that are electrically coupled to the second group of TSVs through these conductive traces. At least one of the electrical contacts of the second passive device is electrically coupled to the TSV in the second group of TSVs that provides an electrical pathway for supplying power from the active surface to the back surface of the second bottom die. Another TSV in the second group of TSVs is connected to a power terminal within the second bottom die (e.g., in an interconnection layer proximate the active surface of the die). In various examples, the second passive device(s) can include a capacitor, resistor, inductor, or combinations thereof. The electrical contacts may be recessed die pads for hybrid bonding or die pads electrically and mechanically coupled to conductive interconnects (e.g., microbumps) for metallurgical bonding. In some examples, the first passive device stacked on the first bottom die and the second passive device stacked on the second bottom die are placed on the respective back surfaces opposite respective PHY regions, as discussed above.

In view of the foregoing, readers of skill in the art will appreciate that implementations in accordance with the present disclosure provide a number of advantages. Compared to die-side passive devices, the footprint of the semiconductor package may be reduced by stacking the passive devices on a bottom die. Compared to land or ball side passive devices, the space available for land or ball side interconnects may be increased by moving passive devices from this side to the stacked arrangement disclosed above. Passive devices can be placed in closer proximity to the integrated circuitry of the die to reduce capacitive and inductive parasitics. When the passive device includes a capacitor, these passive devices can be placed in close proximity to a die-to-die interconnect region of the bottom die to provide the shortest path to deliver power to these high speed I/O connections.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor package assembly comprising:
a first die including a first TSV (Through Silicon Via) and a second TSV, wherein the first TSV supplies power received at a first surface of the first die to a second surface of the first die;
a first passive device coupled to the second surface of the first die such that conductive contacts of the first passive device electrically interface with the first and second TSV, wherein the first passive device receives power supplied through the first TSV and supplies power to the first die through the second TSV, wherein the second TSV terminates at a power bus positioned within the first die between the first surface and the second surface; and
a second die coupled to the second surface of the first die such that conductive contacts of the second die electrically interface with a third TSV and a fourth TSV included in the first die, wherein the third TSV terminates at the power bus, and wherein the second die receives power supplied from the first passive device through a pathway that sequentially includes the second TSV, the power bus, and the third TSV.

2. The semiconductor package assembly of claim 1, wherein the pathway configured to provide power to the second die sequentially includes the first TSV, the first passive device, the second TSV, the power bus, and the third TSV.

3. The semiconductor package assembly of claim 1 further comprising:
a second die including a third TSV and a fourth TSV, wherein the third TSV supplies power received at a first surface of the second die to a second surface of the second die;
a second passive device coupled to the second surface of the second die such that conductive contacts of the second passive device electrically interface with the third TSV and fourth TSV in the second die, wherein the second passive device receives power supplied through the third TSV and supplies power to the second die through the fourth TSV, wherein the fourth TSV terminates at a power bus within the second die;
a mold layer including encapsulant material partially encapsulating the first die, the second die, the first passive device, and the second passive device; and
a redistribution layer structure fabricated on the first surface of the first die, the first surface of the second die, and coplanar surfaces of the mold material.

4. The semiconductor package assembly of claim 3, wherein:

the first passive device is coupled to an area of the second surface of the first die opposite a PHY ('Physical Device') region of the first surface of the first die; and
the second passive device is coupled to an area of the second surface of the second die opposite a PHY region of the first surface of the second die.

5. The semiconductor package assembly of claim 1, wherein the first passive device is a chip capacitor.

6. The semiconductor package of claim 1, wherein the first passive device includes a decoupling capacitor.

7. The semiconductor package of claim 6, wherein the first passive device stores energy in the decoupling capacitor using power received through the first TSV, and wherein the first passive device supplies power to the first die through the second TSV using the energy stored in the decoupling capacitor.

8. The semiconductor package of claim 1, wherein the first passive device stores energy in a capacitor using power received through the first TSV, and wherein the first passive device supplies power to the first die through the second TSV using the energy stored in the capacitor.

9. The semiconductor package of claim 1, wherein the second TSV terminates at the power bus positioned within the first die between the first surface and the second surface at a device layer of the first die.

10. The semiconductor package of claim 1, wherein the first passive device is bonded to the second surface of the first die by microbumps.

11. The semiconductor package of claim 1, wherein the first passive device is bonded to the second surface of the first die using a hybrid bonding process.

12. An apparatus comprising:
a substrate; and
a semiconductor package assembly mounted on the substrate, the semiconductor package assembly comprising:
a first die including a first TSV (Through Silicon Via) and a second TSV, wherein the first TSV supplies power received from the substrate at an first surface of the first die to a second surface of the first die;
a first passive device coupled to the second surface of the first die such that conductive contacts of the first passive device electrically interface with the first TSV and second TSV, wherein the first passive device receives power through the first TSV and supplies power to the first die through the second TSV, wherein the second TSV terminates at a power bus positioned within the first die between the first surface and the second surface; and
a second die coupled to the second surface of the first die such that conductive contacts of the second die electrically interface with a third TSV and a fourth TSV included in the first die, wherein the third TSV terminates at the power bus, and wherein the second die receives power supplied from the first passive device through a pathway that sequentially includes the second TSV, the power bus, and the third TSV.

13. The apparatus of claim 12, wherein the pathway configured to provide power to the second die sequentially includes the first TSV, the first passive device, the second TSV, the power bus, and the third TSV.

14. The apparatus of claim 12, wherein the semiconductor package assembly includes:
a second die including a third TSV and a fourth TSV, wherein the third TSV supplies power from an first surface of the second die to a second surface of the second die;

a second passive device coupled to the second surface of the second die such that conductive contacts of the second passive device electrically interface with the third TSV and the fourth TSV, wherein the second passive device receives power through the third TSV and supplies power to the second die through the fourth TSV, wherein the fourth TSV terminates at a power bus within the second die;

a mold layer including encapsulant material partially encapsulating the first die, the second die, the first passive device, and the second passive device; and a redistribution layer structure fabricated on the first surface of the first die, the first surface of the second die, and coplanar surfaces of the mold material.

15. The apparatus of claim 14, wherein:

the first passive device is coupled to an area of the second surface of the first die opposite a PHY ('Physical Device') region of the first surface of the first die; and

the second passive device is coupled to an area of the second surface of the second die opposite a PHY region of the first surface of the second die.

16. The apparatus of claim 12, wherein the first passive device is a chip capacitor.

17. The apparatus of claim 12, wherein the first passive device includes a decoupling capacitor.

18. The apparatus of claim 17, wherein the first passive device stores energy in the decoupling capacitor using power received through the first TSV, and wherein the first passive device supplies power to the first die through the second TSV using the energy stored in the decoupling capacitor.

19. The apparatus of claim 12, wherein the first passive device is bonded to the second surface of the first die by microbumps.

20. The apparatus of claim 12, wherein the first passive device is bonded to the second surface of the first die using a hybrid bonding process.

* * * * *